(12) United States Patent
Nodake

(10) Patent No.: US 11,025,038 B2
(45) Date of Patent: Jun. 1, 2021

(54) METHODS AND APPARATUS FOR A CURRENT CIRCUIT

(71) Applicant: SEMICONDUCTOR COMPONENTS INDUSTRIES, LLC, Phoenix, AZ (US)

(72) Inventor: Yasuhiro Nodake, Oizumi-machi (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 753 days.

(21) Appl. No.: 15/891,474

(22) Filed: Feb. 8, 2018

(65) Prior Publication Data
US 2019/0245328 A1 Aug. 8, 2019

(51) Int. Cl.
| | | |
|---|---|---|
| H02H 3/00 | (2006.01) | |
| H01T 15/00 | (2006.01) | |
| F02P 7/077 | (2006.01) | |
| H03K 3/01 | (2006.01) | |
| G01R 19/00 | (2006.01) | |

(52) U.S. Cl.
CPC ............. *H01T 15/00* (2013.01); *F02P 7/077* (2013.01); *G01R 19/0092* (2013.01); *H03K 3/01* (2013.01)

(58) Field of Classification Search
None
See application file for complete search history.

(56) References Cited

U.S. PATENT DOCUMENTS

| | | | | |
|---|---|---|---|---|
| 4,058,775 A | * | 11/1977 | Crowle | H03F 1/52 330/267 |
| 4,651,038 A | * | 3/1987 | Cline | G01R 31/31713 323/313 |
| 6,956,428 B1 | * | 10/2005 | Voo | G05F 3/265 327/538 |
| 9,236,840 B1 | * | 1/2016 | Adut | H03F 1/3211 |
| 2007/0164720 A1 | | 7/2007 | Lalithambika | |
| 2009/0153131 A1 | | 6/2009 | Fujii | |
| 2014/0334051 A1 | | 11/2014 | Yagyu et al. | |

FOREIGN PATENT DOCUMENTS

JP    2006078204 A    9/2004

* cited by examiner

*Primary Examiner* — Stephen W Jackson
(74) *Attorney, Agent, or Firm* — Noblitt & Newson, PLLC; Hettie L. Haines

(57) ABSTRACT

Various embodiments of the present technology comprise a method and apparatus for a current circuit. According to various embodiments, the current circuit may be utilized for current detection or current limiting. The current circuit may be configured to compensate for a base current, making detection of an input current more accurate.

20 Claims, 13 Drawing Sheets

//METHODS AND APPARATUS FOR A CURRENT CIRCUIT

BACKGROUND OF THE TECHNOLOGY

An ignition coil typically used in ignition systems may be electrically controlled by an igniter that detects and/or limits a current through the ignition coil (i.e., the coil current). In some cases, however, temperature and processing variations introduce error in the system and may affect the igniter's ability to accurately detect and/or limit the coil current. The error is generally the result of a base current, which is a complicated function of temperature, generated by bipolar transistors during operation. The base current is also related to the hybrid parameter forward current gain value (hfe), which varies according to variations in processing.

Conventional circuits that utilize MOS transistors, for example as illustrated in FIG. 4, may provide output characteristics which are not influenced by the hfe since MOS transistors do not have a base current. However, the MOS transistor has a much larger threshold voltage mismatch than the bipolar transistor and so it still produces error in the detection current. Circuits such as this require an additional adjustment circuit, such as trimming circuitry, to compensate for these variations, which increases the area of the die and/or the cost of the die.

SUMMARY OF THE INVENTION

Various embodiments of the present technology comprise a method and apparatus for a current circuit. According to various embodiments, the current circuit may be utilized for current detection or current limiting. The current circuit may be configured to compensate for a base current, making detection of an input current more accurate.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

FIG. 1 representatively illustrates an ignition system in accordance with an exemplary embodiment of the present technology;

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various power supplies, current supplies, voltage-to-current converters, ignition coils, and the like, which may carry out a variety of functions. In addition, the present technology may be practiced in conjunction with any number of systems, such as automotive, marine, and aerospace, and the systems described are merely exemplary applications for the technology. Further, the present technology may employ any number of conventional techniques for providing a control signal, providing a current supply, and the like.

Figure 1:
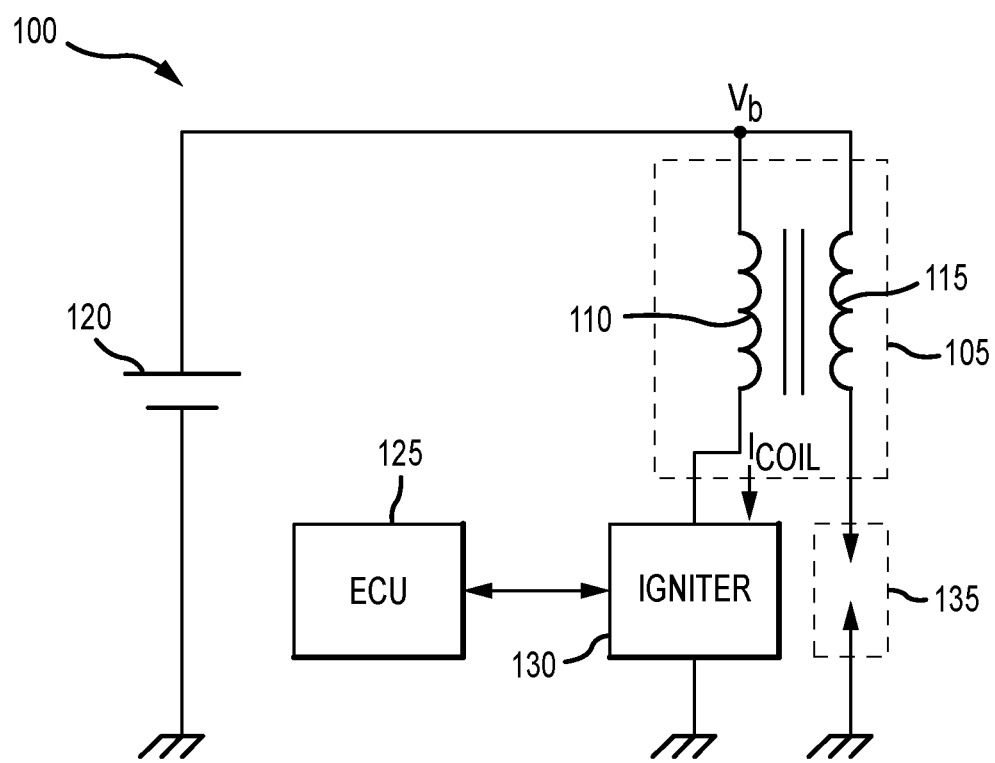

Methods and apparatus for a current circuit according to various aspects of the present technology may operate in conjunction with any system requiring current detection and/or current limiting functions, such as an ignition system utilized in an automobile with an internal combustion engine, and the like. Referring to FIGS. 1 and 2, an exemplary ignition system 100 may be incorporated into an automotive system powered by an internal combustion engine. For example, in various embodiments, the ignition system 100 may comprise an electronic control unit (ECU) 125, an igniter 130, a load, such as an ignition coil 105, a power source 120, and a spark plug 135 that operate together to generate a very high voltage and create a spark that ignites the fuel-air mixture in the engine's combustion chambers.

The power source 120 acts as a power supply to the ignition system 100. For example, the power source 120 may generate a DC (direct current) voltage supply. The power source 120 may comprise any suitable device and/or system for generating power. For example, the power source 120 may comprise any suitable battery, such as a 12-volt lead-acid battery, a 24-volt battery, a 48-volt battery, commonly used in automotive applications. In an exemplary embodiment, the power source 120 may be coupled to the ignition coil 105. In various embodiments, the power source 120 may also be coupled to other components, such as the ECU 125 through regulators (not shown), to facilitate operation.

The ECU 125 may control various operations of one or more components in the ignition system 100. For example, the ECU 125 may be configured to transmit various control signals representing an ON/OFF mode, a particular operating state, and the like. In an exemplary embodiment, the ECU 125 may be coupled to the igniter 130 and configured to transmit an ECU signal to operate the igniter 130. For example, the ECU signal may represent the ON/OFF mode of the igniter 130, which in turn controls operation of the ignition coil 105. In some cases, the ECU 125 may malfunction, resulting in unintended operation of the igniter 130 and ignition coil 105.

In general, the ECU 125 may be programmed with a predetermined dwell time, which is the preferred amount of time that the ignition coil 130 should be in the ON mode to achieve normal operation. The dwell time may be selected according to the particular application, the rated size of the power source 120, and/or transformation capabilities of the ignition coil 105. In some cases, the dwell time be based on a predetermined coil current limit, such that the ECU 125 turns off the igniter 130 when a load current, such as a coil current $I_{COIL}$, reaches the predetermined coil current limit. In a case where the ECU 125 does not turn off the igniter 130 at the desired time, the igniter 130 and ignition coil 105 will continue to operate in the ON mode for a period of time referred to as "over dwell."

The ignition coil 105 transforms the DC voltage of the power source 120 to a higher voltage needed to create an electric spark in the spark plug 135, which in turn ignites the fuel-air mixture fed to the engine. For example, the ignition coil 105 may be electrically coupled to a positive terminal of the power source 120 and the spark plug 135. The ignition coil 105 may comprise any suitable coil, for example an induction coil, and generate the coil current $I_{COIL}$.

In various embodiments, the ignition coil 105 may comprise a primary coil 110 with a primary voltage $V_{C1}$ and a secondary coil 115 with a secondary voltage $V_{C2}$. In an exemplary embodiment, the primary coil 110 comprises a wire with relatively few turns and the secondary coil 115 comprises a wire thinner than that used in the primary coil 110 with many more turns. In general, the ignition coil 105 may be described according to a turn ratio N, which is the number of turns of the secondary coil 115 (N2) to the number of turns of the primary coil 110 (N1) (N=N2/N1). In general, the secondary voltage $V_{C2}$ is equal to the primary voltage $V_{C1}$ multiplied by the turn ratio. Accordingly, the secondary voltage $V_{C2}$ is higher than the primary voltage $V_{C1}$. In an exemplary embodiment, the primary coil 110 may be coupled to the igniter 130 and the secondary coil 115 may be coupled to the spark plug 135.

According to various embodiments, the igniter 130 controls and/or measures (or detect or sense) the coil current $I_{COIL}$. In an exemplary embodiment, the igniter 130 may be coupled to the primary coil 110 and the coil current $I_{COIL}$ may be a current through the primary coil 110. The igniter 130 may comprise various circuits and/or systems for current detection, signal amplification, controlling and/or limiting a current, and the like.

Figure 10:
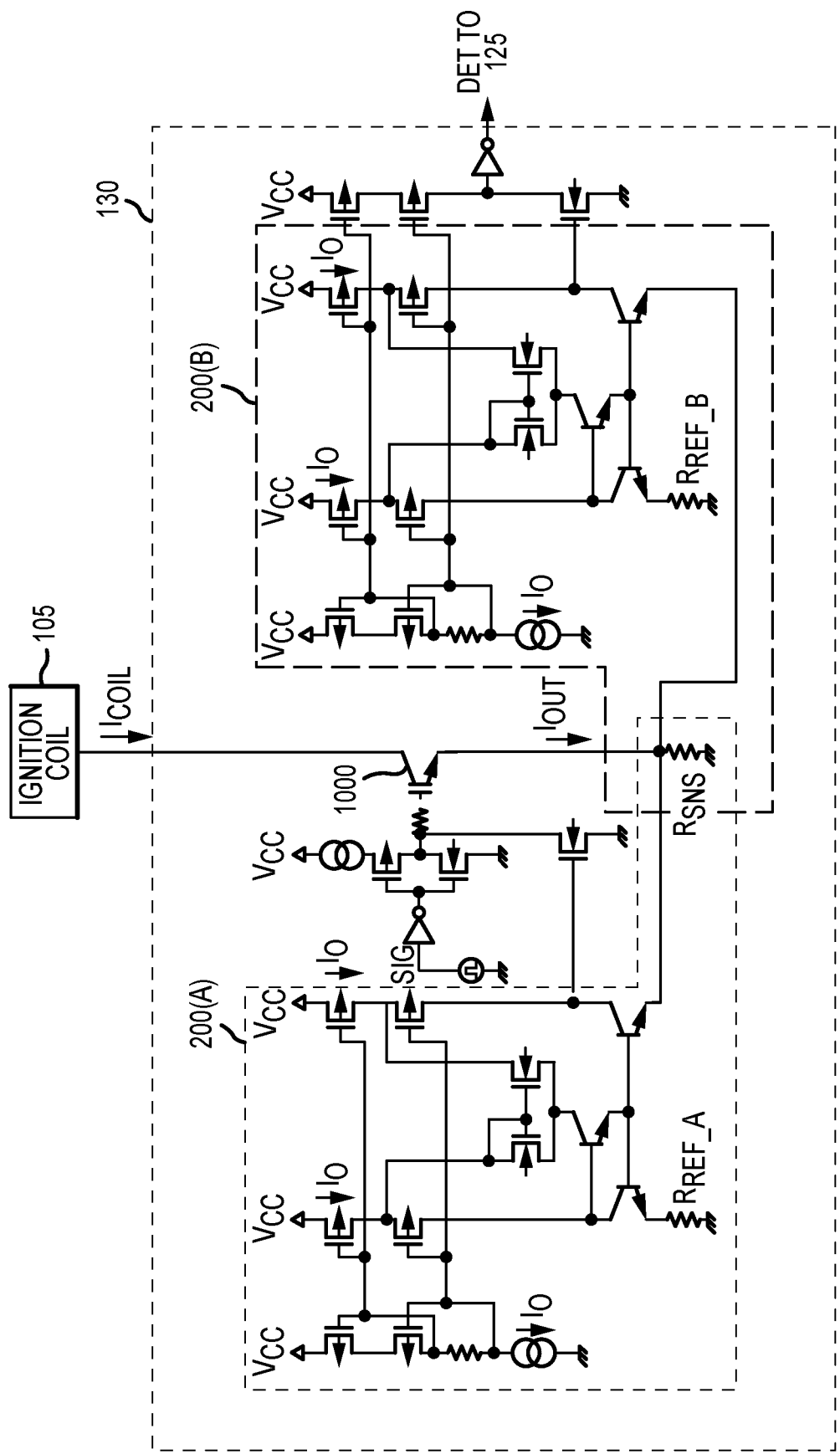
FIG. 10 is circuit diagram of an igniter output stage in accordance with an exemplary embodiment of the present technology.
Figure 11:
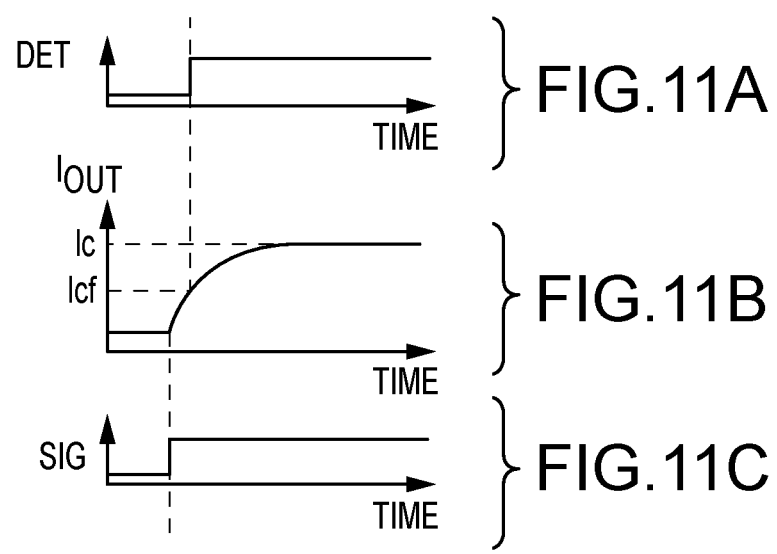
FIG. 11A is a current detection signal waveform in accordance with an exemplary embodiment of the present technology.
FIG. 11B is an output current waveform in accordance with an exemplary embodiment of the present technology.
FIG. 11C is a control input signal waveform in accordance with an exemplary embodiment of the present technology.

Referring to FIG. 10, and according to an exemplary embodiment, the igniter 30 may comprise a switch element 1000 configured to turn ON and OFF according to a signal, such as a control signal SIG. The control signal SIG may be generated internally within the igniter 130 and may correspond to a control signal from the ECU 125. When the switch element 1000 is ON, the coil current $I_{COIL}$ flows through the switch element 1000. In an exemplary embodiment, the igniter 130 further comprises an amplifier circuit, such as an inverted amplifier circuit, to amplify the control signal SIG.

The igniter 130 may be configured to detect and control the coil current $I_{COIL}$. In an exemplary embodiment, the igniter 130 comprises a current circuit 200, such as a first current circuit 200(A) and a second current circuit 200(B), wherein the first and second current circuits 200(A), 200(B) are coupled together and both are coupled to the switch element 1000. In various alternative embodiments, the igniter 130 may comprise only the first current circuit 200(A).

The first current circuit 200(A) may operate in conjunction with the switch element 1000 and function as a protection circuit to generate a desired coil current $I_{COIL}$ and/or limit the coil current $I_{COIL}$. For example, the first current circuit 200(A) may be coupled to an input of the switch element 1000, wherein the switch element 1000 is responsive to an output of the first current circuit.

The second current circuit 200(B) may be coupled to the switch element 1000 and share the sense resistor $R_{SNS}$ with the first current circuit 200(A) and function as a detection circuit. For example, the second current circuit 200(B) may be configured to detect the coil current $I_{COIL}$ and compare the coil current $I_{COIL}$ to a predetermined value to determine if the coil current $I_{COIL}$ is greater than a predetermined value. The second current circuit 200(B) may be further configured to report the result of the comparison to the ECU 125.

Figure 2A:
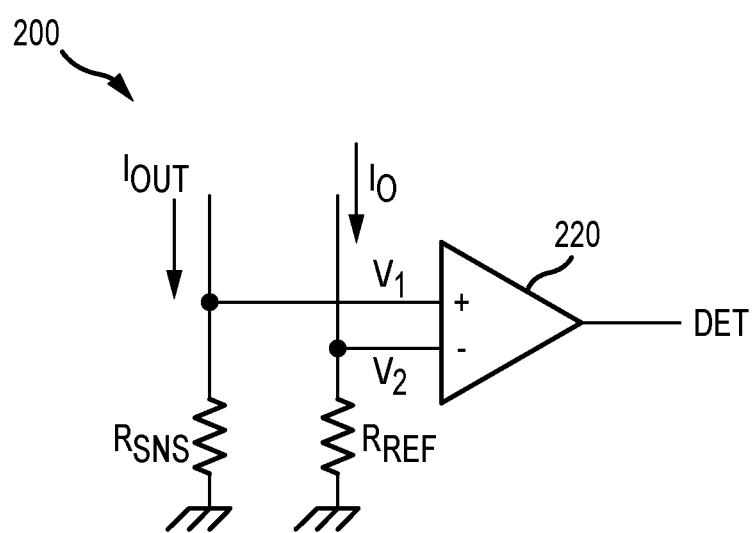
FIG. 2A is an equivalent circuit diagram of a current circuit in accordance with an exemplary embodiment of the present technology.
Figure 2B:
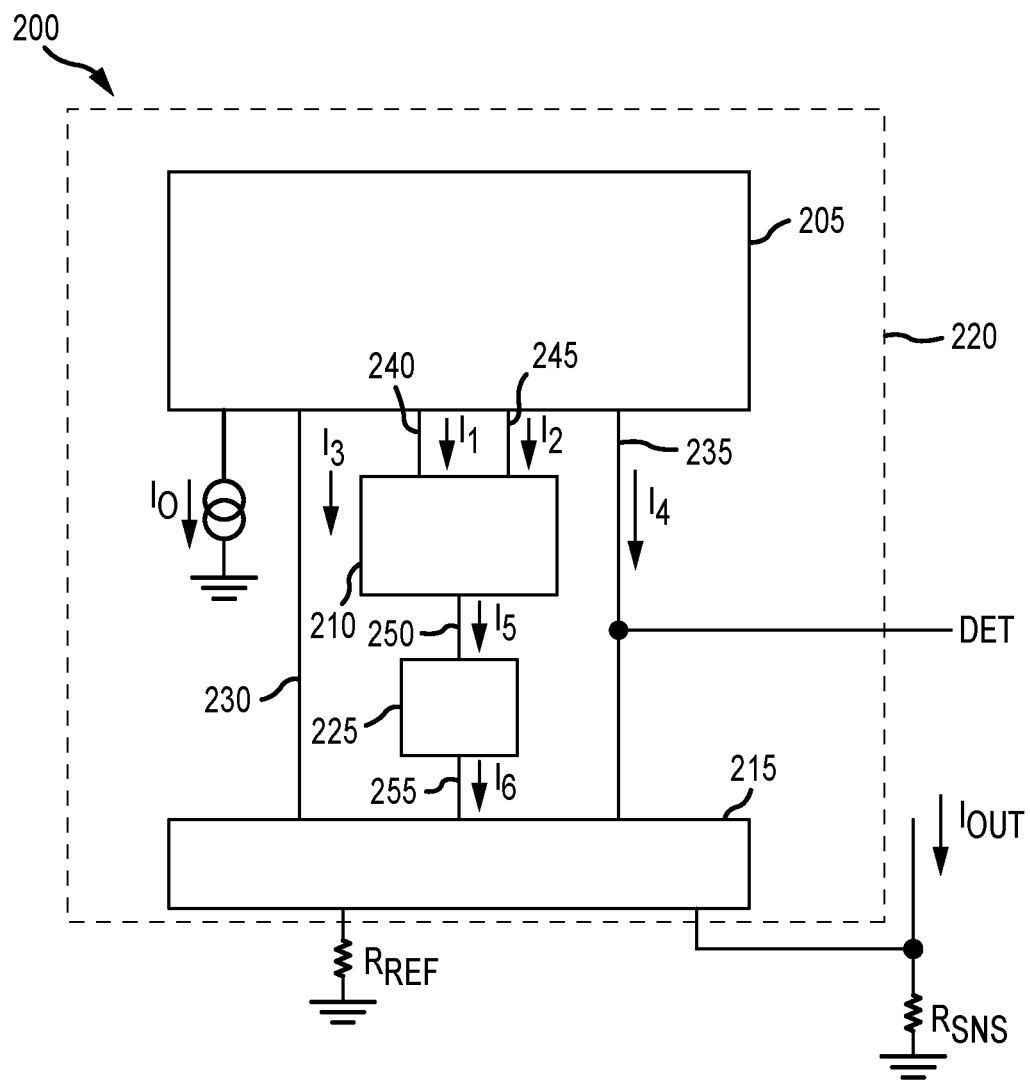
FIG. 2B is a block diagram of a current circuit in accordance with an exemplary embodiment of the present technology.
Figure 2C:
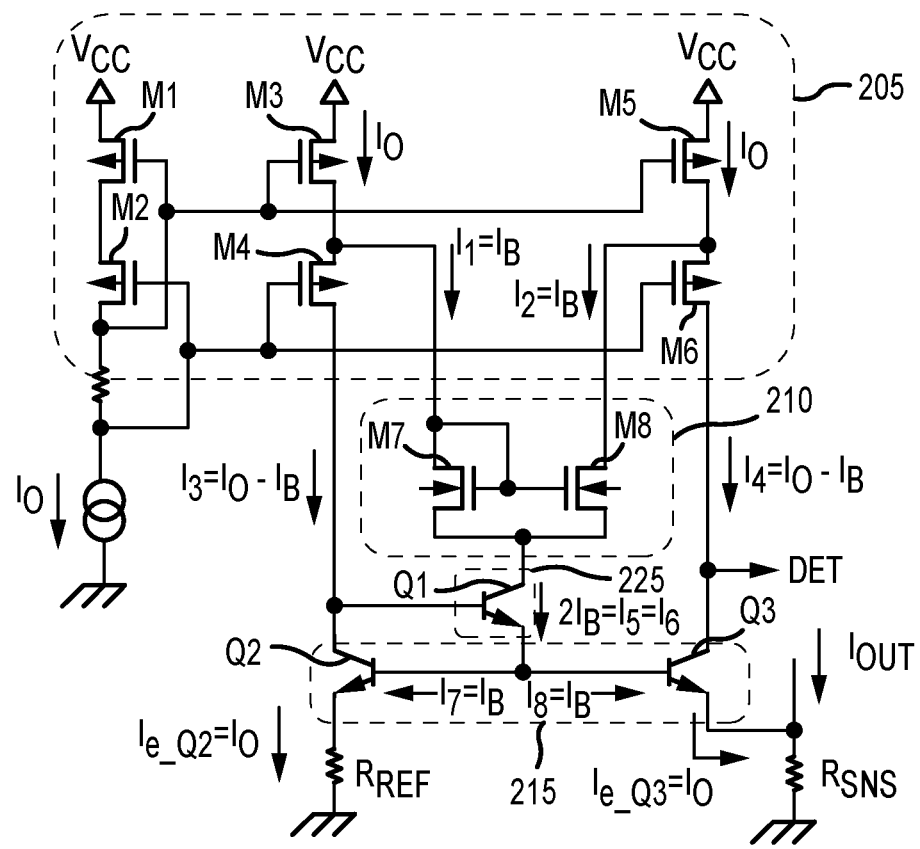
FIG. 2C is a circuit diagram of a current circuit in accordance with an exemplary embodiment of the present technology.
Figure 3:
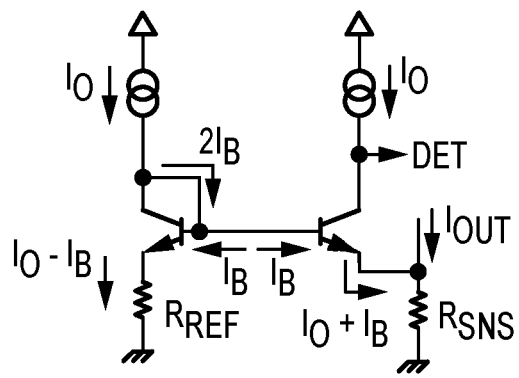
FIG. 3 is a circuit diagram of a first conventional current circuit.
Figure 4:
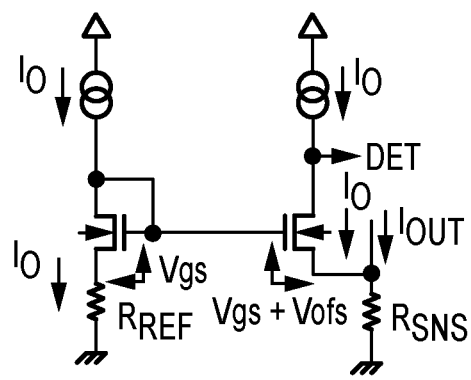
FIG. 4 is a circuit diagram of a second conventional current circuit.
Figure 5:
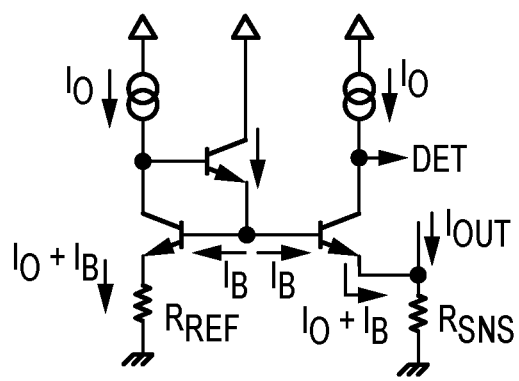
FIG. 5 is a circuit diagram of a third conventional current circuit.

Referring to FIGS. 2A-C, the current circuit 200 may be configured as one of a current limiting circuit and a current detecting circuit. For example, the current circuit 200 may be configured to receive and detect a magnitude of an output current $I_{OUT}$, such as the coil current $I_{COIL}$. The particular function of the current circuit 200 may be selected according to a particular application and/or desired use.

Referring to FIG. 2A, an equivalent circuit of the current circuit 200 having an n:m transistor ratio where n=1 and m=1 (i.e., 1:1 transistor ratio) may comprise an operational amplifier 220 configured to compare a first input voltage V1 to a second input voltage V2 and output a detection signal DET according to the comparison. For example, the first voltage V1 may comprise a voltage potential across a sense resistor $R_{SNS}$ according to the output current $I_{OUT}$, and the second voltage V2 may comprise a voltage potential across a reference resistor $R_{REF}$ according to a source current $I_O$. According to various embodiments, the reference resistor $R_{REF}$ has a fixed resistance value and the sense resistor $R_{SNS}$ has a fixed resistance value, where the resistance value of the reference resistor $R_{REF}$ is much larger than the resistance value of the sense resistor $R_{SNS}$.

According to an exemplary embodiment, and referring to FIGS. 2B-C, the operational amplifier 220 comprises a first current mirror circuit 205, a second current mirror circuit 210, a compensation circuit 225, and a differential input circuit 215 that operate in conjunction with the sense resistor $R_{SNS}$ and the reference resistor $R_{REF}$ to detect or control the output current $I_{OUT}$.

The first current mirror circuit 205 may generate identical currents. The first current mirror circuit 205 may comprise any circuit suitable for generating mirrored currents. In an exemplary embodiment, the first current mirror circuit 205 is configured as a cascoded current mirror circuit comprising a plurality of transistors, such as transistors M1:M6. According to various embodiments, the transistors M1:M6 may be P-channel MOS transistors. The first current mirror circuit 205 may be coupled to a current source, which provides a constant source current $I_O$. The current source 235 may comprise any suitable circuit and/or system configured to generate a predetermined current. According to various embodiments, the first current mirror circuit 205 may be further coupled to a supply voltage $V_{DD}$.

According to an exemplary embodiment, the first current mirror circuit 205 is coupled to the second current mirror circuit 210, wherein a first current $I_1$, which is proportional to a base current $I_B$, flows from the first current mirror circuit 205 to the second current mirror circuit 210 along a first current path 240. For example, the first current $I_1$ may be equal to the base current $I_B$ (i.e., $I_1=I_B$). A second current $I_2$, which is proportional to the base current $I_B$, flows from the first current mirror circuit 205 to the second current mirror circuit 210 along a second current path 245. For example, the second current $I_2$ may be equal to the base current $I_B$ (i.e., $I_2=I_B$). In various embodiments, the first and second currents $I_1$, $I_2$ are equal to source/drain currents through transistors M3 and M5, respectively.

According to the present embodiment, the base current $I_B$ represents the base current of a bipolar transistor having a collector current $I_O$. (i.e., $I_B=I_O/hfe$, where the hfe is the current gain of the bipolar transistor).

The first current mirror circuit 205 may be further coupled to the differential input circuit 215, wherein a third current $I_3$, which is proportional to the source current Io minus the base current $I_B$, flows from the first current mirror circuit 205 to the differential input circuit 215 along a third current path 230. For example, the third current $I_3$ may be equal to the source current Io minus the base current $I_B$ (i.e., $I_3=Io-I_B$). A fourth current $I_4$, which is proportional to the source current Io minus the base current $I_B$, flows from the first current mirror circuit 205 to the differential input circuit 215 along a fourth current path 235. For example, the fourth current $I_4$ may be equal to the to the source current Io minus the base current $I_B$ (i.e., $I_4=Io-I_B$).

The second current mirror circuit 210 is configured to generate identical currents. For example, the second current mirror circuit 210 may comprise a plurality of transistors, such as transistors M7 and M8, and generate the first and second currents $I_1$, $I_2$. The second mirror circuit 210 may be coupled to the compensation circuit 225, wherein a fifth current $I_5$, which is proportional to the base current $I_B$, flows from the second current mirror circuit 210 to the compensation circuit 225 along a fifth current path 250. For example, the fifth current $I_5$ may be equal to two times the base current $I_B$ (i.e., $I_5=2I_B$). In the present embodiment, both transistors M7, M8 are N-channel MOS transistors.

The compensation circuit 225 compensates for the base current $I_B$. In an exemplary embodiment, the compensation circuit 225 may comprise a bipolar transistor Q1 coupled to the second current mirror circuit 210 via a first terminal and coupled to the differential input circuit 215 via a second terminal. A sixth current $I_6$, which is proportional to the base current, flows through the compensation circuit 225 and to the differential input circuit 215 along a sixth current path 255. For example, the sixth current $I_6$ may be equal to two times the base current $I_B$ (i.e., $I_6=2I_B$). A third terminal of the compensation circuit 225 may be coupled to the first current path 230.

The differential input circuit 215 may be coupled to the output current $I_{OUT}$ and generate the base current $I_B$. In an exemplary embodiment, the differential input circuit 215 may comprise a transistor pair comprising bipolar transistors Q2 and Q3. The transistors Q2 and Q3 may be coupled via respective base terminals and/or share a base terminal. Each transistor Q2, Q3 of the bipolar pair may generate a seventh current $I_7$ and an eighth current $I_8$, at the respective base terminals. In the present embodiment, the seventh and eighth currents $I_7$, $I_8$ may equal the base current $I_B$ (i.e., $I_7=I_8=I_B$).

In an exemplary embodiment, the transistor Q2 may have an emitter current $I_{e\_Q2}$ equal to the source current Io (i.e., $I_{e\_Q2}=Io$) and the transistor Q3 may have an emitter current $I_{e\_Q3}$ equal to the source current Io (i.e., $I_{e\_Q3}=Io$). According to various embodiments, an emitter terminal of the transistor Q2 is coupled to the reference resistor $R_{REF}$ and an emitter terminal of the transistor Q3 is coupled to the sense resistor $R_{SNS}$.

According to the present embodiment, the current circuit 200 is configured such that the first current $I_1$ is equal to the seventh current $I_7$, and that the second current $I_2$ is equal to the eighth current $I_8$ in order to cancel or otherwise compensate for the effect that the base current $I_B$ has on the detection signal DET and perform the desired characteristics.

Figure 8:
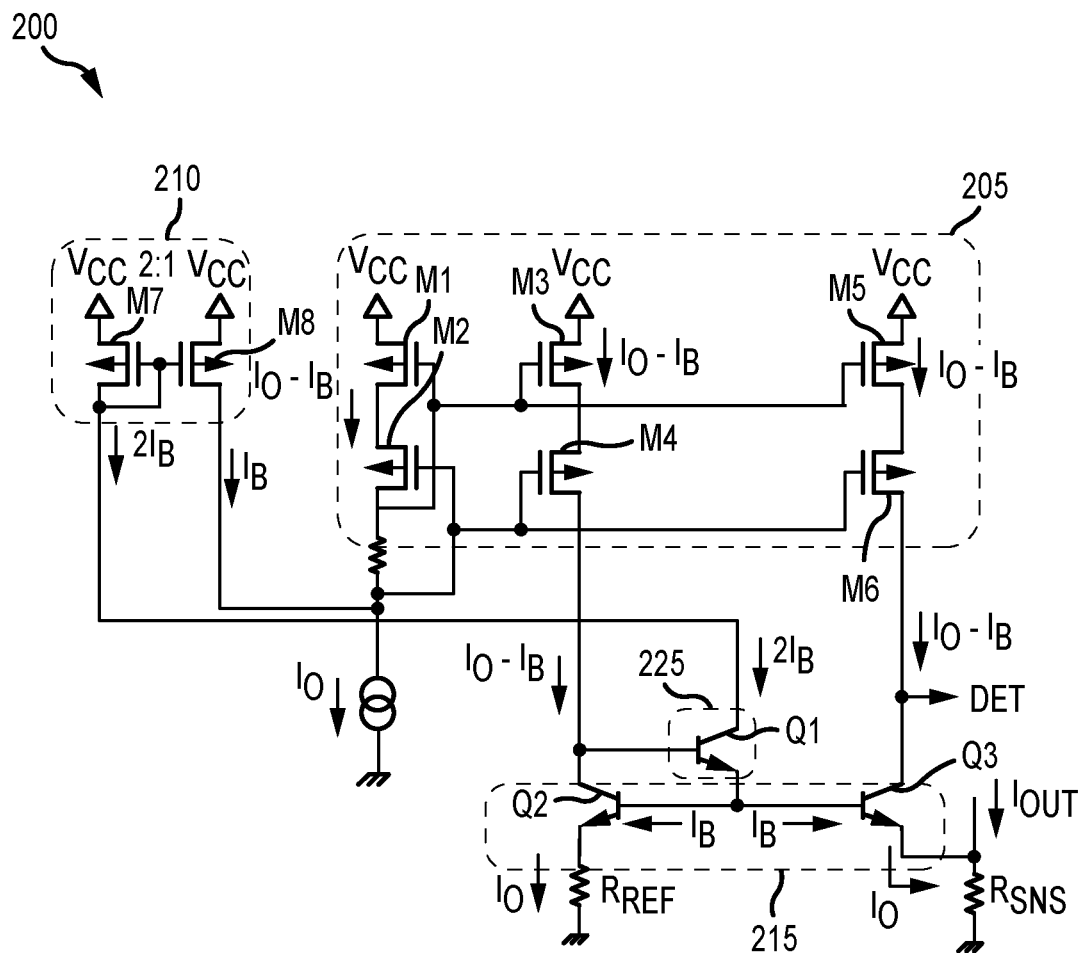
FIG. 8 is a circuit diagram of a current circuit in accordance with a second embodiment of the present technology.

Referring to FIG. 8, according to a second embodiment, the second current mirror circuit 210 may be coupled to the first current mirror circuit 205, the compensation circuit 225, and directly to the supply voltage $V_{DD}$. According to the present embodiment, transistors M7 and M8 are P-channel MOS transistors.

Figure 9:
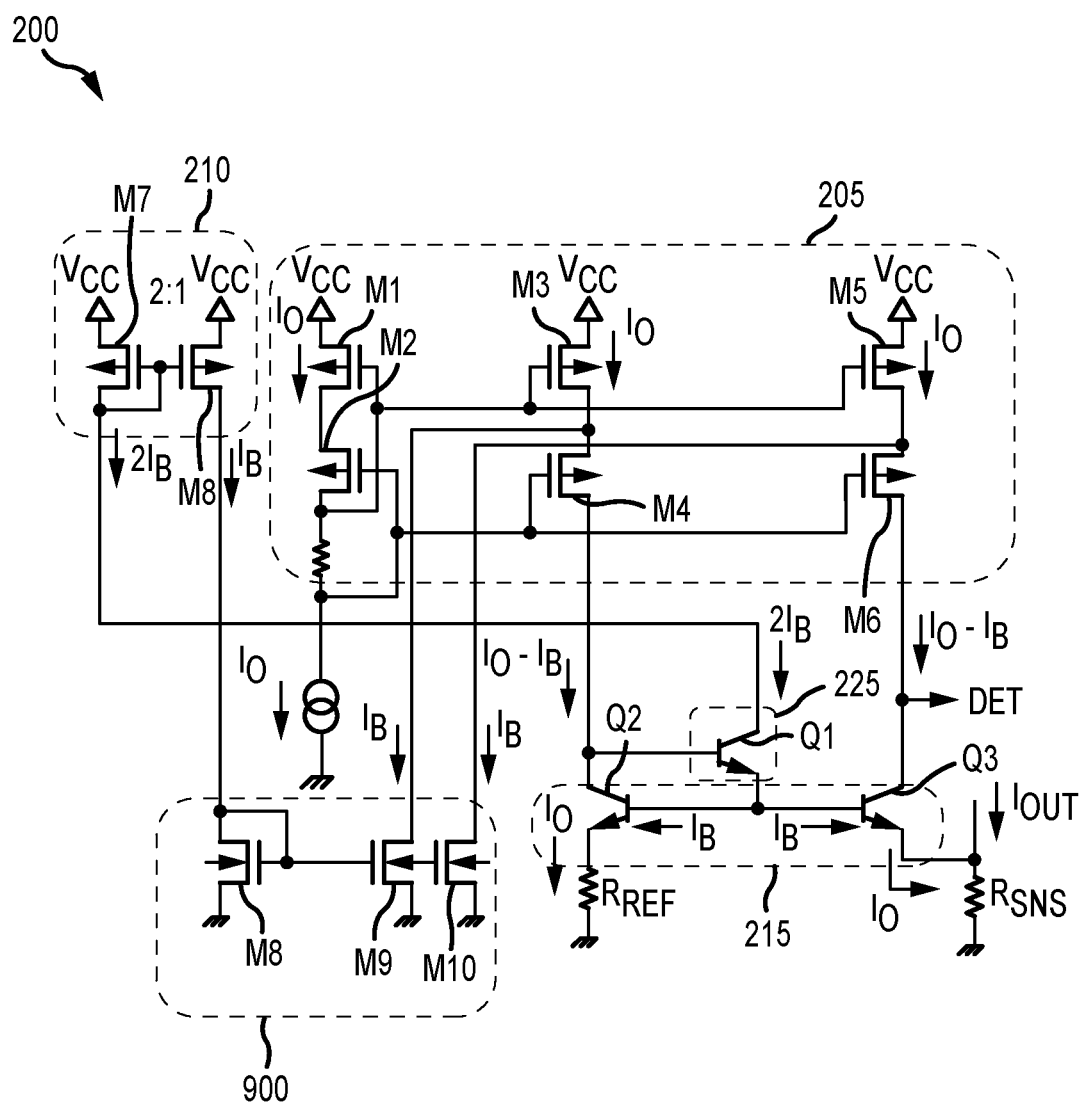
FIG. 9 is a circuit diagram of a current circuit in accordance with a third embodiment of the present technology.

Referring to FIG. 9, according to a third embodiment, the current circuit 200 may further comprise a third current mirror circuit 900 comprising a plurality of transistors, such as transistors M8:M10. The third current mirror circuit 900 may be coupled to the first current mirror circuit 205 and the second current mirror circuit 210. According to the present embodiment, the transistors M8:M10 are N-channel MOS transistors.

Figure 12:
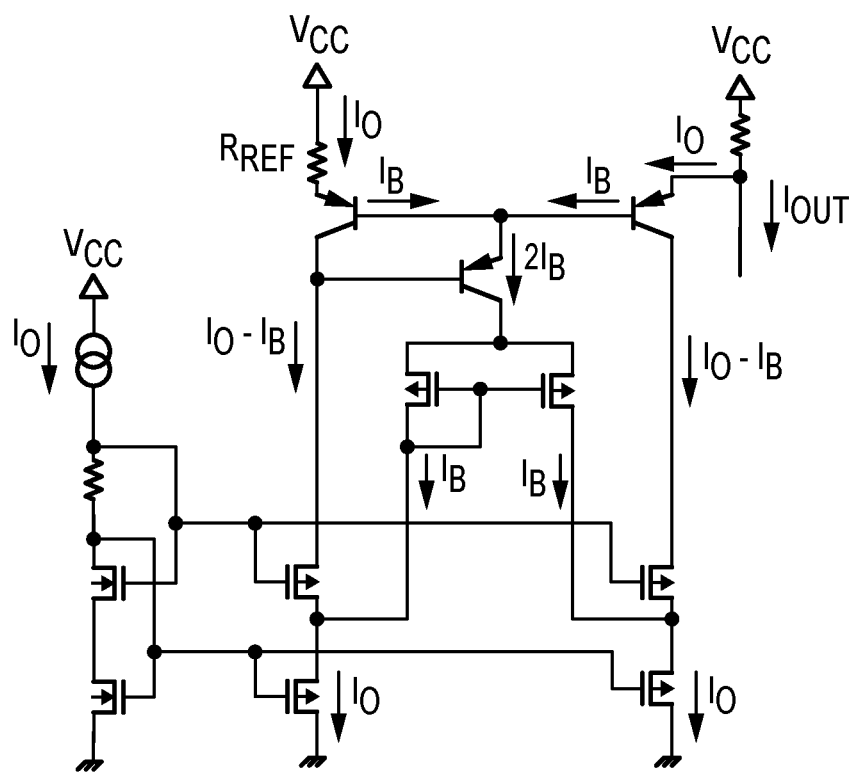
FIG. 12 is a circuit diagram of a current circuit in accordance with a fourth embodiment of the present technology.

Referring to FIG. 12, in a fourth embodiment, the current circuit 200 may be configured to have an inversed polarity.

Figure 13:
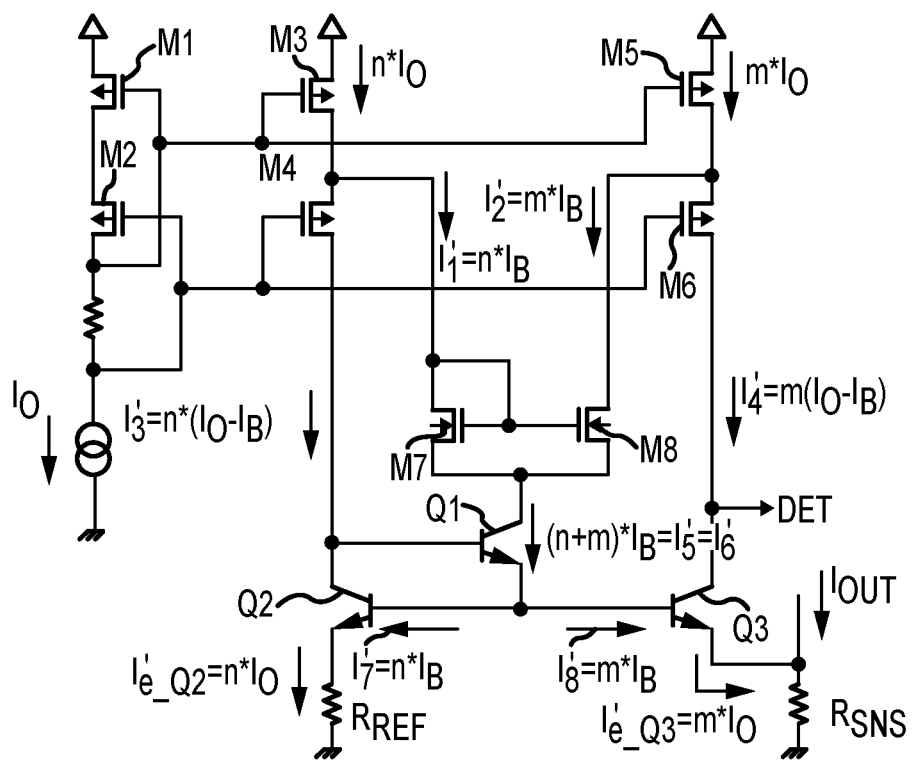
FIG. 13 is a circuit diagram of a current circuit in accordance with a fifth embodiment of the present technology.

Referring to FIG. 13, in a fifth embodiment, where transistor characteristics of the current circuit 200 may be described as having an n:m transistor ratio, n≠1 and m≠1, and where M1:M3:M5=1:n:m, M7:M8=n:m, M2:M4:M6=1:n:m, and Q2:Q3=n:m. Accordingly, if the size of transistor M1 is defined as $S_{M1}$ and the size of transistor M2 is defined as $S_{M2}$, then the size of transistor M3 is $n*S_{M1}$, the size of transistor M4 is $n*S_{M2}$, the size of transistor M5 is $m*S_{M1}$, and the size of transistor M6 is $m*S_{M2}$. Further, if the size of transistor M7 is defined as $S_{M7}$, then the size of transistor M8 is $m/n*S_{M7}$. Further, if the size of transistor Q2 is defined as $S_{Q2}$, then the size of transistor Q3 is $m/n*S_{Q2}$.

According to the present embodiment, a first current $I'_1$ may be equal to a first transistor factor n multiplied the base current $I_B$ (i.e., $I'_1=n*I_B$); a second current $I'_2$ may be equal to a second transistor factor m multiplied the base current $I_B$ (i.e., $I'_2=m*I_B$); a third current $I'_3$ may be equal to the first transistor factor n multiplied by the source current Io minus the base current $I_B$ (i.e., $I'_3=n*(Io-I_B)$); a fourth current $I'_4$ may be equal to the second transistor factor m multiplied by the source current Io minus the base current $I_B$ (i.e., $I'_4=m*(Io-I_B)$); a fifth current $I'_5$ may be equal to the first transistor factor n plus the second transistor factor m multiplied by the based current ((i.e., $I'_5=(n+m)*I_B$); a sixth current $I'_6$ may be equal to the first transistor factor n plus the second transistor factor m multiplied by the based current ((i.e., $I'_6=(n+m)*I_B$); a seventh current $I'_7$ may equal the first transistor factor n multiplied by the base current (i.e., $17=n*I_B$); an eighth current $I'_8$ may be equal to the second transistor factor m multiplied by the base current $I_B$ (i.e., $I'8=m*I_B$); the transistor Q2 may have an emitter current ($I'_{e\_Q2}$) equal to the source current Io multiplied by the first transistor factor n (i.e., $I'_{e\_Q2}=n*Io$); and the transistor Q3 may have an emitter current ($I'_{e\_Q3}$) equal to the source current Io multiplied by the second transistor factor m (i.e., $I'_{e\_Q3}=m*Io$).

According to the present embodiment, the current circuit 200 is configured such that first current $I_1'$ is equal to the seventh current $I_7'$ and the second current $I_2'$ is equal to the eighth current $I_8'$ in order to cancel or otherwise compensate for the effect that the base current $I_B$ has on the detection signal DET and perform the desired characteristics.

According to various embodiments, the various currents, such as $I_1$, $I'_1$, $I_2$, $I'_2$, $I_3$, $I'_3$, etc., may also be described as being proportional to the first and second transistor factors n,m. For example, the first current $I_1$, $I'_1$ is proportional to the first transistor factor n and the fourth current $I_4$ is proportional to the second transistor factor m.

Figure 6:
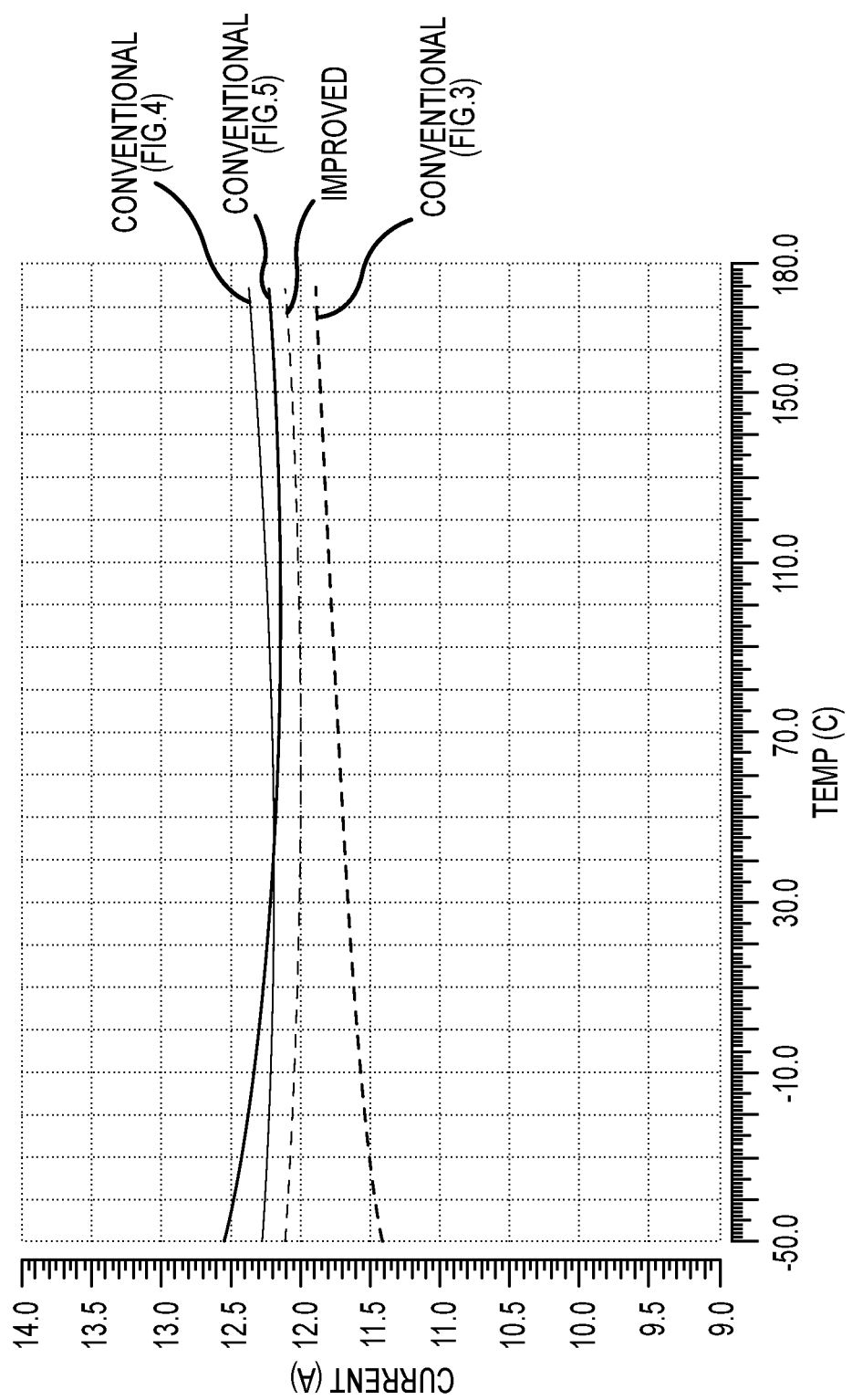
FIG. 6 illustrates detection currents for various circuits across various temperatures and at a first hybrid parameter forward current gain (hfe) value in accordance with an exemplary embodiment of the present technology.
Figure 7:
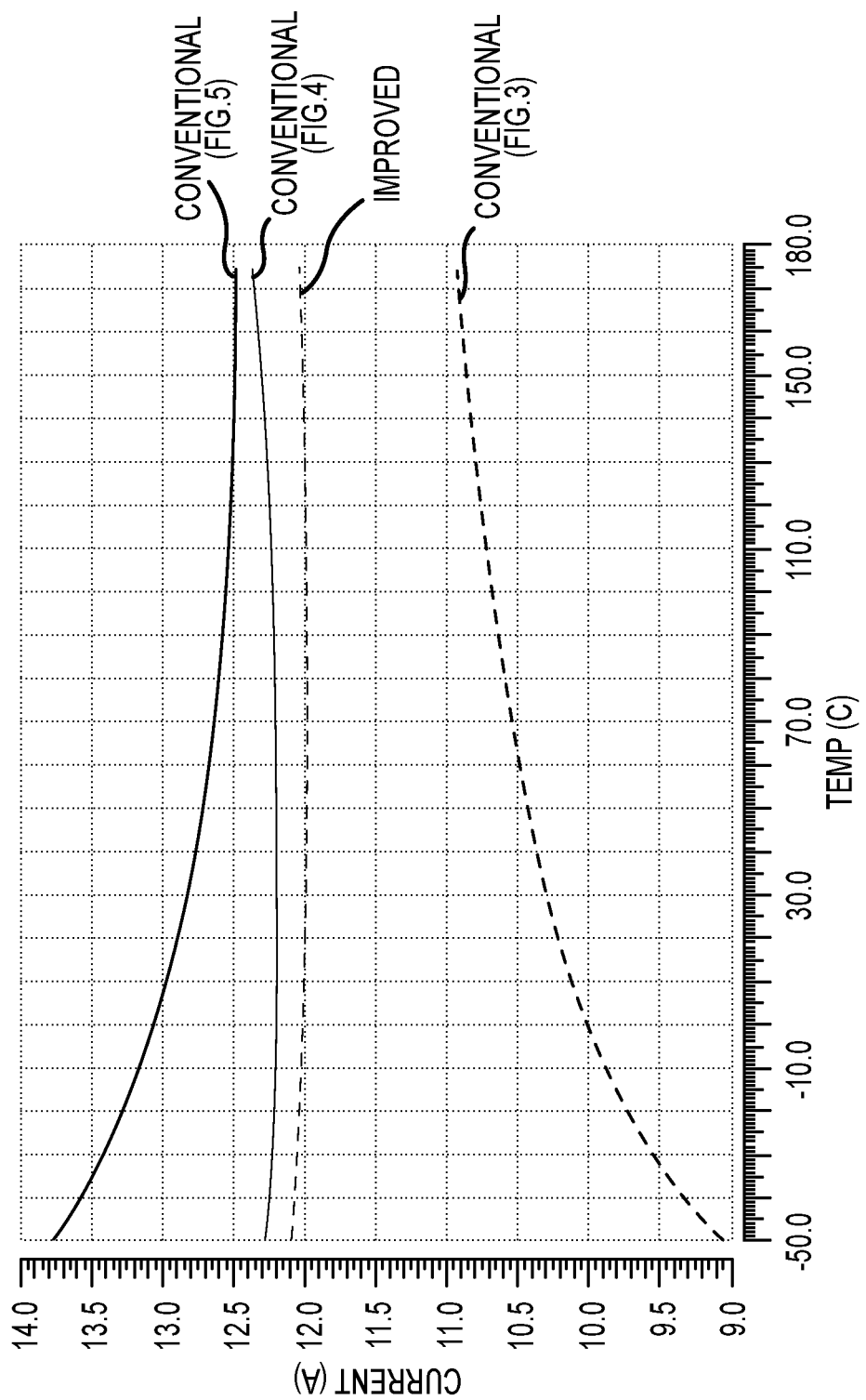
FIG. 7 illustrates detection currents for various circuits across various temperatures and at a second hybrid parameter forward current gain (hfe) value in accordance with an exemplary embodiment of the present technology.

According to various embodiments, in operation, the current circuit 200 provides a substantially fixed output current at a given voltage across various temperatures and across various devices having differing hybrid parameter forward current gain (hfe) values by compensating for the base current $I_B$ generated by the differential input circuit 215 during operation. For example, and referring to FIGS. 6 and 7, the differential input circuit 215 is described by the following conditions: hfe=71, Vb=14V, and Vcc=5V (FIG. 6); and hfe=18.7, Vb=14V, and Vcc=5V (FIG. 7). According to various embodiments of the present technology, the output current $I_{OUT}$ of the current circuit 200 remains substantially stable as the temperature increases from −50 degrees Celsius to 180 degrees Celsius. Conversely, the output current of conventional circuits varies across temperatures from −50 degrees Celsius to 180 degrees Celsius and/or varies from an expected current leading to errors in detection. According to various embodiments of the present technology, the current circuit 200 generates an output current $I_{OUT}$ is also substantially stable at 12.1 A with an hfe of 71 and an hfe of 18.7. Conversely, the output current of conventional circuits varies not only according to temperature, but also with differing hfe values. Therefore, the output current $I_{OUT}$ is not influenced by the base current $I_B$ and detection of a particular magnitude of the output current is more accurate.

According to various operations, when the output current $I_{OUT}$, such as the coil current $I_{COIL}$, reaches predetermined threshold values, the igniter 130 responds. For example, and referring to FIGS. 10 and 11A-C, where the first current circuit 200(A) functions as a current limiter and the second current circuit 200(B) functions as a current detector, as the output current $I_{OUT}$ increases, the second current circuit 200(B) responds when the output current reaches a first threshold Icf (where Icf=Io×$R_{REF\_B}$/$R_{SNS}$) by generating and transmitting the detection signal DET to the ECU 125. When the output current $I_{OUT}$ reaches a second threshold Ic (where Ic=Io×$R_{REF\_A}$/$R_{SNS}$), the first current circuit 200(A) responds to limit a gate voltage of the switching element 1000, which in turn, limits the coil current $I_{COIL}$. Accurately detecting and limiting the coil current $I_{COIL}$ may ensure proper operation of the ignition coil 105 and prevent damage to the ignition coil 105.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A current circuit capable of generating a base current, comprising:
   a first current mirror circuit;
   a current source connected to the first current mirror circuit and configured to generate a source current;
   a second current mirror circuit connected to the first current mirror circuit;
   an input circuit comprising:
      a first transistor; and
      a second transistor;

wherein a base terminal of the first transistor is connected to a base terminal of the second transistor at a first node; and a current compensation circuit connected between the first node and the second current mirror circuit;

wherein the current detection circuit outputs a detection signal based on a load current.

2. The current circuit according to claim 1, wherein the first current mirror circuit comprises a plurality of transistor configured as a cascoded current mirror circuit.

3. The current circuit according to claim 1, wherein the current compensation circuit is further connected to the first current mirror circuit.

4. The current circuit according to claim 1, wherein the input circuit further comprises:

a reference resistor coupled to the first transistor; and a sense resistor coupled to the second transistor.

5. The current circuit according to claim 1, wherein the detection signal is independent of the base current.

6. The current circuit according to claim 5, the current compensation transistor generates a current equal to twice the base current.

7. The current circuit according to claim 1, wherein the detection signal is independent of a temperature of the current detection circuit.

8. The current circuit according to claim 1, wherein the input circuit is further connected to the first current mirror circuit via a first connection and a second connection.

9. The current circuit according to claim 1, wherein:

the first current mirror circuit is configured to supply a first current to the input circuit, wherein the first current is equal to the source current minus the base current; and the current compensation transistor is configured to supply a second current to the input circuit, wherein the second current is equal to twice the base current to the input circuit.

10. The current circuit according to claim 1, wherein:

the first current mirror circuit is configured to supply a first current to the input circuit, wherein the first current is equal to a first transistor factor multiplied by the source current minus the base current; and the current compensation transistor is configured to supply a second current to the input circuit, wherein the second current is equal to a sum of the first transistor factor and a second transistor factor multiplied by the base current.

11. A method for detecting a load current, comprising:

receiving the load current;

providing a source current;

generating a base current;

compensating for the base current; and generating a detection signal according to the load current;

wherein the detection signal is independent of:

the base current; and a change in temperature.

12. The method according to claim 11, wherein compensating for the base current comprises:

generating a first current proportional to a first transistor factor plus a second transistor factor;

generating a second current proportional to the first transistor factor;

generating a third current proportional to the second transistor factor; and splitting the first current into two currents, wherein one of the split currents is proportional to the first transistor factor and the remaining split current is proportional to the second transistor factor.

13. The method according to claim 11, wherein generating the detection signal comprises:

generating a first voltage potential that is proportional to the load current; and comparing the first voltage potential to a second voltage potential.

14. The method according to claim 11, wherein:

the detection signal comprises a digital signal; and generating the detection signal comprises switching to one of a high signal and a low signal when the load current reaches a predetermined threshold.

15. The method according to claim 14, wherein the predetermined threshold is fixed across a plurality of operating temperatures and a plurality of hybrid parameter forward current gain values.

16. A system, comprising:

a load configured to generate a load current;

an igniter, connected to the load and configured to detect the load current, comprising:

an operational amplifier comprising:

a cascoded current mirror circuit;

a current splitting circuit connected to the cascoded current mirror circuit;

an input circuit configured to detect the load current and comprising:

a bipolar first transistor; and a second bipolar transistor connected to the first bipolar transistor;

wherein first transistor and the second transistor share a base terminal; and a current compensation transistor connected between the base terminal and the second current mirror circuit;

a sense resistor connected to a first terminal of the operational amplifier; and a reference resistor connected to a second terminal of the operational amplifier;

wherein the igniter outputs a detection signal based on the load current.

17. The system according to claim 16, wherein the current compensation transistor: is further connected to the first current mirror circuit;

comprises a bipolar transistor; and is configured to generate an emitter current equal to twice the base current of the input circuit.

18. The system according to claim 16, wherein:

the input circuit is further connected to the cascoded current mirror circuit via a first connection and a second connection; and the cascoded current mirror circuit is configured to supply:

a first current through the first connection, wherein the first current is equal to the source current minus a base current; and a second current through the second connection, wherein the second current is equal to the source current minus the base current.

19. The system according to claim 16, wherein detection signal is independent of a base current of the input circuit.

20. The system according to claim 16, wherein:

the current splitting circuit is connected to the cascoded current mirror circuit via a third connection and a fourth connection; and the cascoded current mirror circuit is configured to supply:

a third current through the third connection, wherein the third current is equal to the base current; and a fourth current through the fourth connection, wherein the fourth current is equal to the base current.

\* \* \* \* \*